United States Patent

Tan

[11] Patent Number: 5,990,820
[45] Date of Patent: Nov. 23, 1999

[54] CURRENT-MODE PIPELINED ADC WITH TIME-INTERLEAVED SAMPLING AND MIXED REFERENCE AND RESIDUE SCALING

[75] Inventor: Nianxiong Tan, Sollentuna, Sweden

[73] Assignee: Telefonaktiebolaget LM Ericsson, Stockholm, Sweden

[21] Appl. No.: 08/848,248

[22] Filed: Apr. 29, 1997

[30] Foreign Application Priority Data

May 7, 1996 [SE] Sweden ................................. 9601747

[51] Int. Cl.$^6$ .............................. H03M 1/44; H03M 1/14
[52] U.S. Cl. ........................................... 341/161; 341/156
[58] Field of Search ..................................... 341/136, 156, 341/161, 162

[56] References Cited

U.S. PATENT DOCUMENTS

| | | | |
|---|---|---|---|
| 4,684,924 | 8/1987 | Wood ....................................... | 341/156 |
| 4,894,657 | 1/1990 | Hwang et al. ........................... | 341/158 |
| 5,043,732 | 8/1991 | Robertson et al. ...................... | 341/156 |

OTHER PUBLICATIONS

Gustavsson et al., New Current–Mode Pipeline A/D Converter Architectures, 1997 IEEE International Symposium on Circuits and Systems Jun. 9–12, 1997, pp. 417–420.
Wong et al. Current–Mode Cyclic A/D Conversion Technique, Electronics Letters, Feb. 4, 1993 vol. 29, No. 3, pp. 249–250.
IEEE Journal of Solid–State Circuits, vol. 30, No. 5, May 1995, Chung–Yu Wu et al., "A CMOS Transistor–Only 8–b 4.5 Ms/s Pipelined Analog–to–Digital Converter Using Fully–Differential Current–Mode Circuit Techniques", pp. 523–532.
IEE Circuits and Systems Series 2, Toumazou, C. et al., "Analogue IC design: the current–mode approach," pp. 491–503.
IEE Circuits and Systems Series 5, Toumazou, C. et al., "Switched–Currents an analogue technique for digital technology," pp. 304–322.

Primary Examiner—Howard L. Williams
Attorney, Agent, or Firm—Burns, Doane, Swecker & Mathis, L.L.P.

[57] ABSTRACT

To convert an analog current to a digital signal using a high-speed pipelined analog-to-digigal (A/D) converter, the A/D converter may comprise a current sample- and hold (S/H) circuit at the input and several identical pipelined stages, where each stage contains a current S/H circuit, a current interstage low-resolution A/D converter and current references. To improve the speed of pipelined current-mode A/D converters the capacitive load seen by the output of every stage will be reduced. By adjusting the reference currents the power consumption will also be reduced. It is possible to achieve about 100 Msamples/s conversion rate and to reduce the power consumption by several times compared with existing designs. To increase the operation speed and to provide means to reduce the power consumption the pipelined current-mode A/D converter may comprise an S/H circuit (7) as the input and N pipelined stages (8), each of which contains an internal low-resolution A/D converter (9), a D/A converter (10), an S/H circuit (11), a reference current source (12) and an adder/subtractor (13). The most distinguishing features of the invented architecture are: 1) the inputs to the internal A/D converter and the interstage S/H circuit are timeinterleaved; and 2) the reference current to the D/A converter in every stage can be different.

7 Claims, 6 Drawing Sheets

CURRENT-MODE PIPELINED ADC WITH TIME-INTERLEAVED SAMPLING AND MIXED REFERENCE AND RESIDUE SCALING

TECHNICAL FIELD

The present invention relates to a method and a device to convert an analog current to a digital signal; more particularly this invention relates to the design of high-speed pipelined analog-to-digital (A/D) converters, where the input analog signal is a current.

BACKGROUND OF THE INVENTION

Traditionally CMOS A/D converters have been designed by using switched-capacitor technique. But these kind of A/D converters usually call for linear capacitors. In a digital CMOS process, there is only one poly layer available. To create linear capacitors in the digital CMOS process, extra process steps are needed, which would increase the cost. It is therefore of interest to design CMOS A/D converters in the digital CMOS process. This can be accomplished by using the current mode approach, see for example: "Analog IC Design: the Current-Mode Approach", C. Toumazou, F. J. Lidgey and D. G. Haig (Eds), Peter Peregrinus Ltd., 1990 and "Switched-Currents: an Analogue Technique for Digital Technology", C. Toumazou, J. B. Hughes and N. C Bettersby (Eds), Peter Peregrinus Ltd., 1993.

A high-speed pipelined A/D converter was presented in "A CMOS transistor—only 8-b 4.5—Ms/s pipelined analog-to-digital converter using fully-differential current-mode curcuit techniques" C. -Y. Wu, C. -C. Chen and J. -J. Cho, IEEE J. Solid—State Circuits, May 1995 pp. 522–532. In FIG. 1 there is shown a 1-bit-per-stage architecture. The A/D converter consists of a current sample-and-hold (S/H) circuit 1 at the input and 8 identical 1-bit pipelined stages 2. Each stage 2 contains a current S/H 3 circuit, an inter stage current amplifier/adder 4, a current comparator 5 and current references 6.

If the input current $I_j$ is positive, the output of the current comparator is ONE and the residual current to the next stage is $(2I_j-I_{ref})$. If the input current $I_j$ is negative, the output of the current comparator is ZERO and the residual current to the next stage is $(2I_j+I_{ref})$. The residual current $I_{j+1}$ is then sent to the next stage to determine next bit. The sampled input currents can therefore be pipelined to determine its digital codes sequentially.

In practical realization the function of multiplication by 2 can be realized in the S/H circuit by using a current mirror as in the reference "A CMOS transistor—only 8-b 4.5—Ms/s pipelined analog-to-digital converter using fully-differential current-mode circuit techniques". However, the current mirrors include extra capacitive load to the S/H circuit, which limits the speed. Another drawback is that every stage is treated equally and therefore the power consumtion cannot be optimized.

In U.S. Pat. No. 4,894,657: "Pipelined analog-to-digital architecture with parallel-autozero analog signal processing" the invention relates to an A/D converter for converting analog signals to digital signals and in particular to a pipelined A/D converter having a cascade connection of A/D-D/A sub-blocks respectively for determining partial bits of a conversion output. The cited invention is based on the traditional voltage-mode approach, and therefore is not in the scope of the invention where a current mode approach is used.

SUMMARY OF THE INVENTION

To improve the speed of pipelined current-mode A/D converters the present invention reduces the capacitive load seen by the output of every stage. By adjusting the reference currents, the method and the device according to the invention also reduces the power consumption. It is possible to achieve about 100 Msamples/s conversion rate and to reduce the power consumption by several times compared with existing designs, when using the invented architectures.

DETAILED DESCRIPTION OF THE INVENTION

Figure 1:
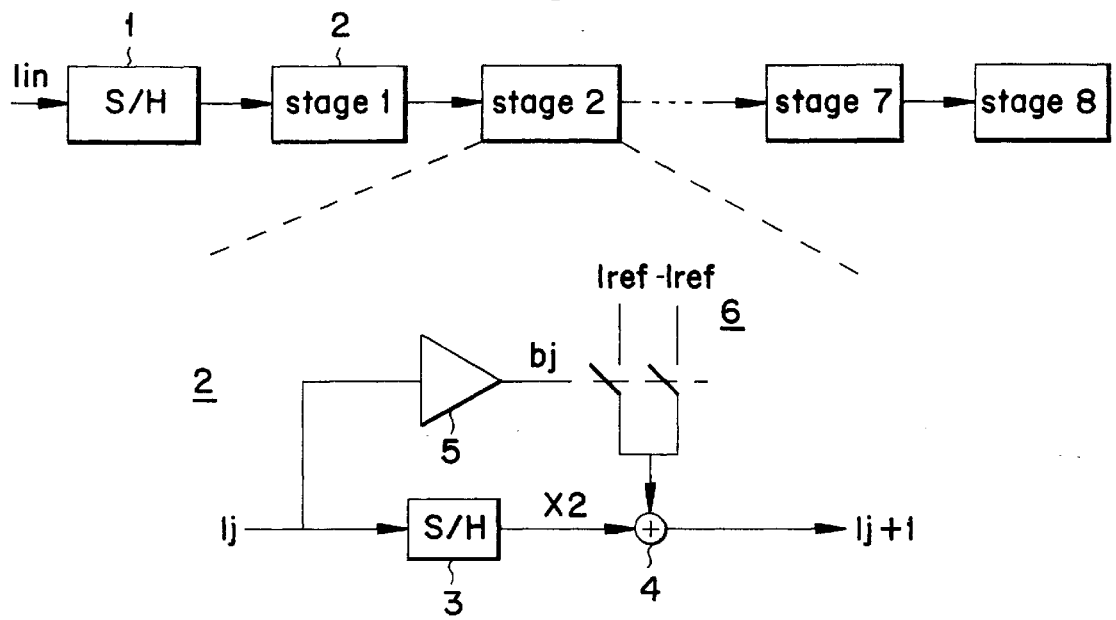
FIG. 1 shows the prior art architecture for a pipelined a current-mode analog-to-digital converter.
Figure 2:
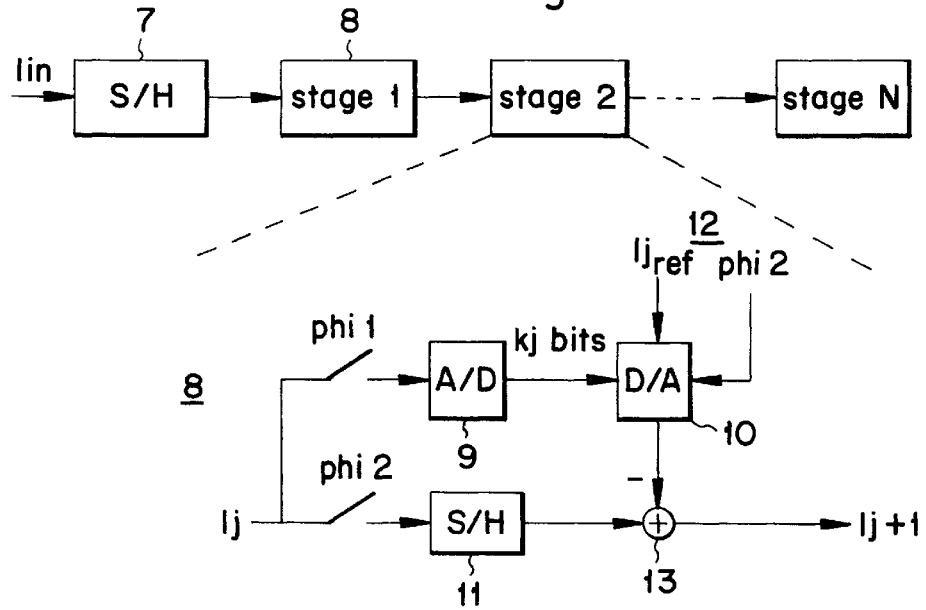
FIG. 2 shows a pipelined current-mode A/D converter arhrchitecture according to the invention.

To increase the operation speed and to provide means to reduce the power consumption, a pipelined current-mode A/D converter architecture is proposed as shown in FIG. 2. The invented architecture consists of an S/H circuit 7 at the input and N pipelined stages 8. Every stage 8 contains an internal low-resolution A/D converter 9, a D/A converter 10, an S/H circuit 11, a reference current source 12 and a current adder/subtractor 13. Every stage 8 does not have to be identical to any other stage. The most distinguishing features of the invented architecture are: 1) the inputs to the internal A/D converter (it can be only a current comparator) and to the interstage S/H circuit are time-interleaved; 2) the reference current to the D/A converter (it can be only a 1-bit converter) in every stage can be different. The converter only needs two clock phases. The operations of three successive stages are illustrated in Table 1, where the auto-zeroing of the internal A/D converter is optional.

|  |  | phase 1 | phase 2 |
| --- | --- | --- | --- |
| stage j − 1 | S/H circuit | sample | hold |
|  | A/D converter | auto-zero | quantization |
|  | D/A converter | change output | hold output |
| stage j | S/H circuit | hold | sample |
|  | A/D converter | quantization | auto-zero |
|  | D/A converter | hold output | change output |
| stage j + 1 | S/H circuit | sample | hold |
|  | A/D converter | auto-zero | quantization |
|  | D/A converter | change output | hold output |

Table 1: The operations of three successive stages.

The input current is first fed to the internal A/D converter 9, which usually has a low resolution, then the input current is switched to the S/H circuit 11 and at the same time the internal D/A converter 10 outputs the current to the current adder/subtractor 13. The output of the current adder/subtractor 13 is sent to the next stage. Therefore the output current is the summation of the output current of the D/A converter 10 and the output current of the S/H circuit 11. It is given by $$I_{j+1}=I_j-((b_j+2\cdot b_2 \ldots +2^{kj-1}\cdot b_{kj})\cdot I_{jref})$$

where the internal A/D converter 9 has $k_j$ output bits.

In order to realize the proper quantization, the reference current of the following stage should be scaled, i.e., $$I_{(j+1)ref} = \frac{I_{jref}}{2^{k_j}}$$

In the new architecture, we do not need to realize the multiplication by the factor of 2, reducing the settling time. The accuracy is mainly determined by the matching of the reference current sources, which is comparable to other structures where accuracy is determined by the matching of current sources and realization of coefficients.

In the new architecture, the settings of the D/A converter 10 and S/H circuit 11 of the preceding stage are directly coupled with the settling of the A/D converter 9 of the current stage, limiting the operation speed. The settling time of a well-designed A/D converter (having a low resolution) is usually only 1/5–1/10 of the settling time of an S/H circuit, and the D/A converter settles usually much faster than other circuits. Compared with the circuits in the prior art, the capacitive load of the S/H circuits 11 in the new structure is much less. Therefore, the invented A/D converter can operate much faster than the existing ones. A data rate of about 100 Msamples/s is possible, according to transistor-level simulation.

Due to the scaling of the reference current sources, the maximum current swing decreases throughout the pipelined stages. Therefore, bias currents can be reduced successively throughout the pipelined stages. Power consumption can thus be reduced dramatically.

The scaling does not have a negative effect on the performance in that the first stage needs highest resolution (equivalent to the resolution of the whole pipelined A/D converter) and the following stages need lower and lower resolution throughout the pipeline. For example, the second stage only needs a bit resolution (resolution specified in the number of bits) equivalent to the bit resolution of the whole A/D converter minus the bit resolution of the first stage.

Figure 3:
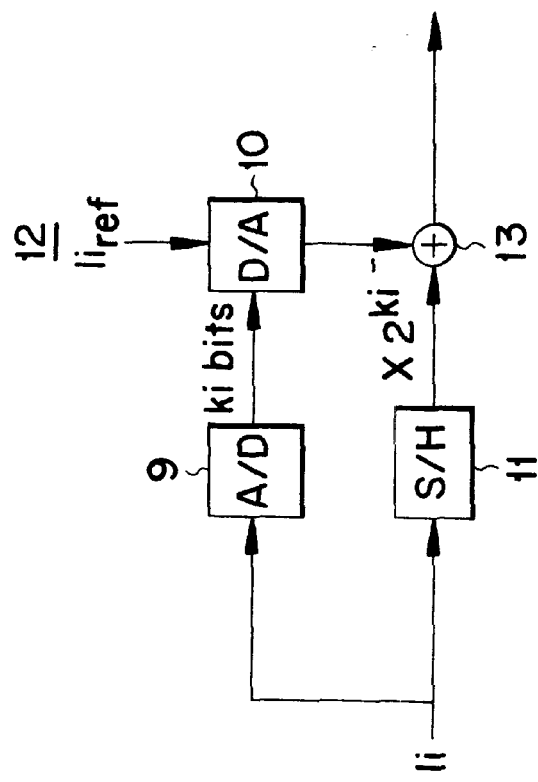
FIG. 3 shows the stages generating LSBs to reduce the spread of reference currents in FIG. 2.
Figure 3:
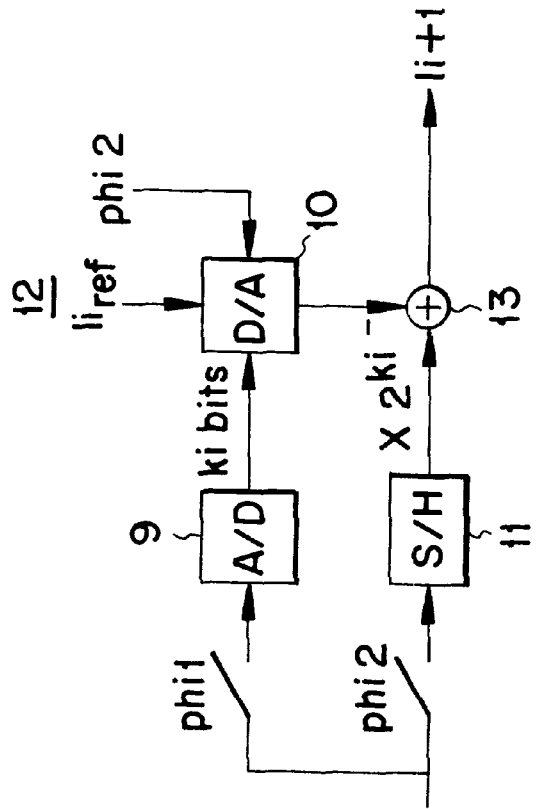

To reduce the spread of reference currents, we can introduce multiplication in the S/H circuit of the stages generating the last significant bits (LSBs). They can take two forms as shown in FIG. 3.

The output current is given by $$I_{i+1} = 2^{k_i}I_i - ((b_1 + 2 \cdot b_2 + \ldots + 2^{k_i-1} \cdot b_{k_i}) \cdot I_{iref})$$

In this case, the following stage has the same reference value $I_{iref}$. Due to the extra capacitive load, the settling time increases. However, the stages generating LSBs do not have the same accuracy requirement and relatively large settling error is acceptable.

Figure 4:
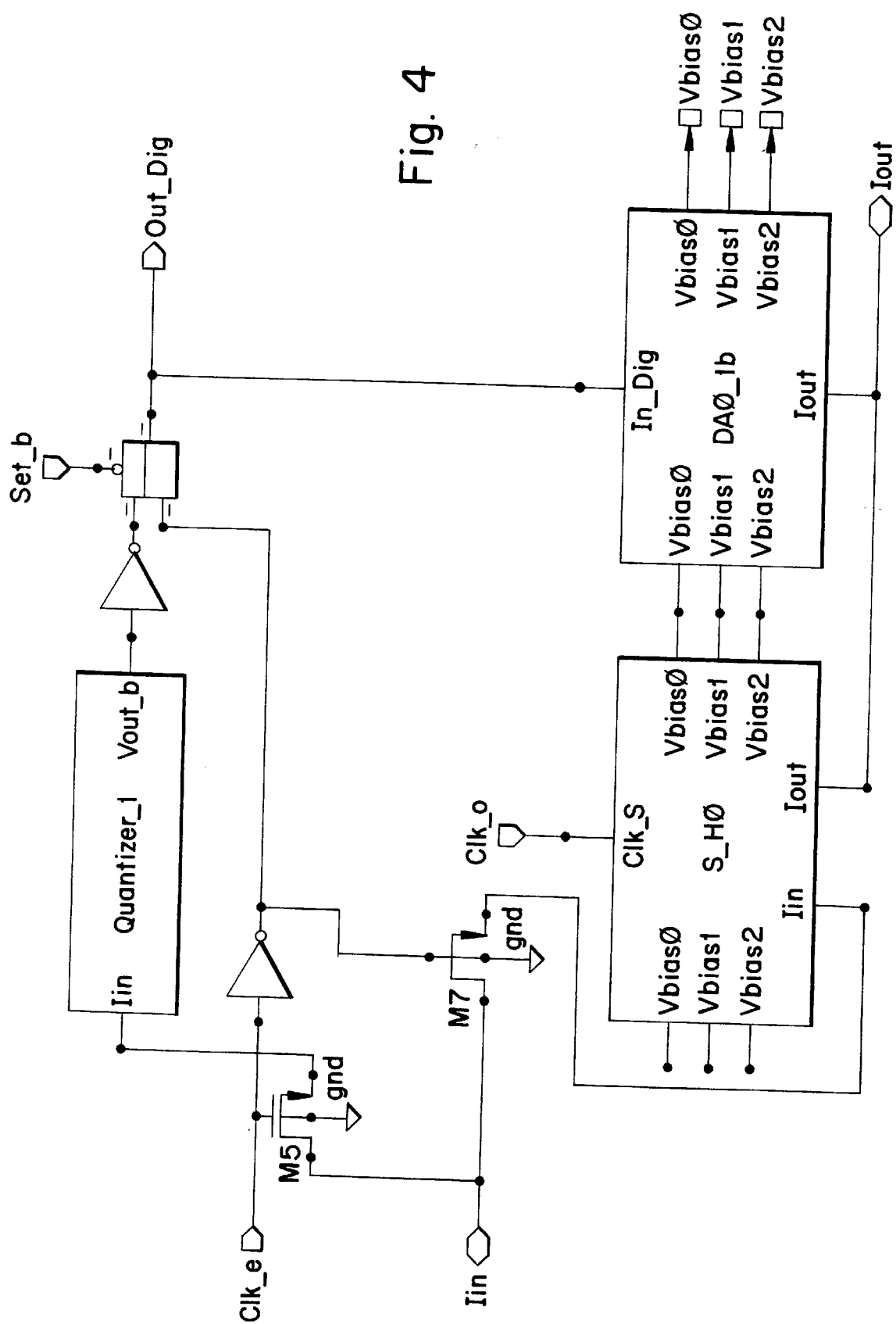
FIG. 4 shows a simplified cicuit diagram of one stage corresponding to the architecture of FIG. 2.

The invented architecture has been implemented in the in-house CMOS process. In this section a simplified circuit solution is presented. In FIG. 4 the simplified circuit diagram of one stage is shown corresponding to FIG. 2. The input current Iin is fed into the current sample-and-hold circuit S_H0 on the odd clock phase Clk_o through switch transistor M7, and is fed into the current quantizer Quantizer_I on the even clock phase Clk_e through transistor M6. The output of the current quantizer Quantizer_I is inverted by an inverter and then latched by a flip-flop resettable by the signal Set_b. The digital output Out_Dig is used to control the D/A converter DA0_1b. The input current to the next stage is Iout, generated by wiring together the output of the sample-and-hold circuit S_H0 and that of the D/A converter DA0_1b. Notice the subtraction in FIG. 2 is implicitly implemented in the D/A converter by properly setting the reference current directions. Vbias0~2 are the bias voltages for the analog blocks S_H0 and DAC0_1b.

Figure 5:
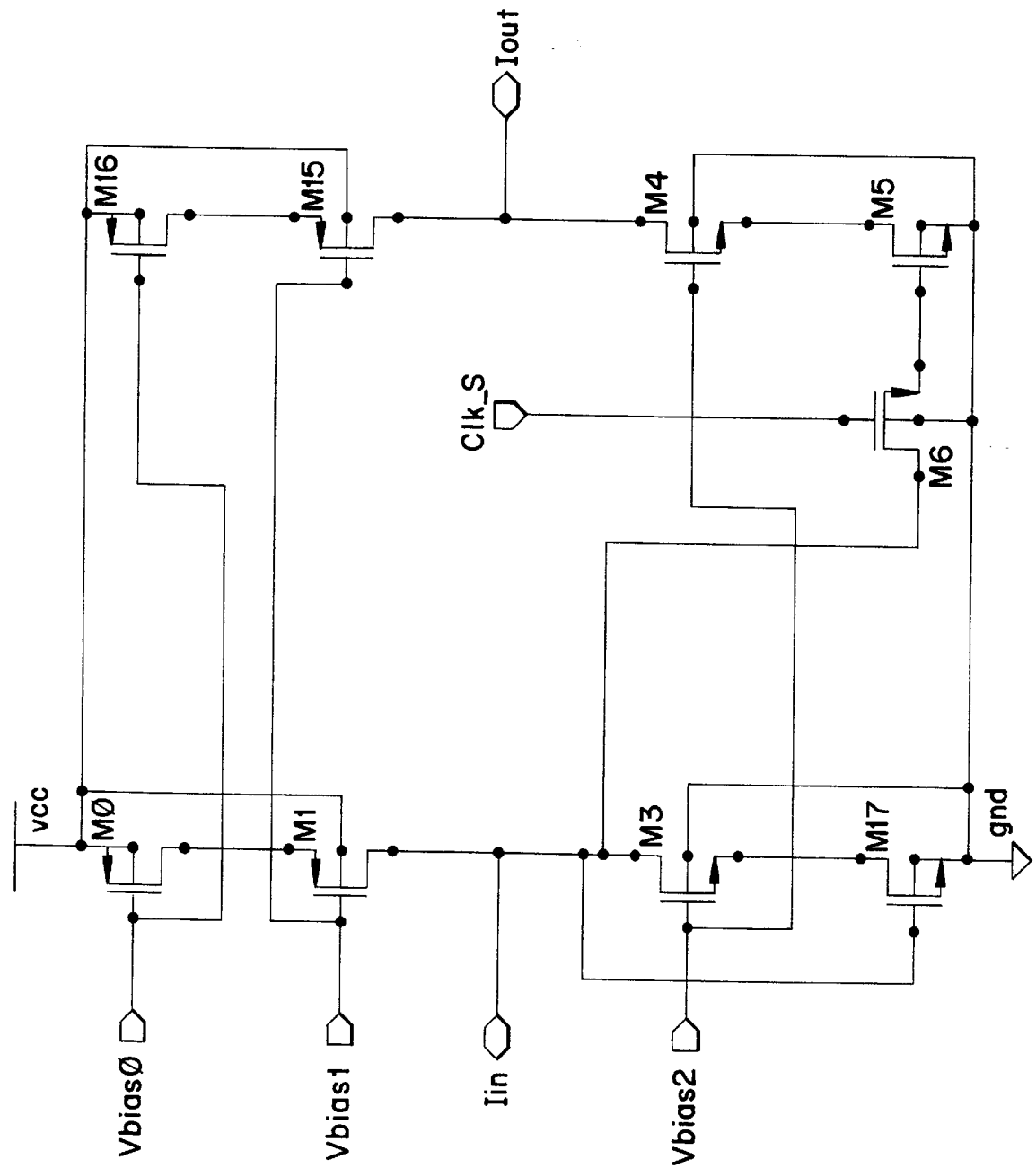
FIG. 5 shows a simplified circuit diagram of current sample-and-hold circuit.

In FIG. 5, the simplified circuit diagram of the current sample-and-hold circuit is shown. The current sample-and-hold circuit is basically a cascode current mirror with a control switch. Transistors M0 and M16 provide bias currents for the input and output, respectively. Transistors M1 and M15 are cascode transistors to increase the output impedance of current sources. Transistors M17 and M5, together with cascode transistors M3 and M4, realize the current mirroring. Transistor M6 is used as a switch controlled by the digital input Clk_S. Iin and Iout are the input and output currents, respectively, and Vbias0~2 are the bias voltages.

When the digital input Clk_S is high, the output current Iout is equal to the input current Iin, due to the same gate-source voltage for transistors M17 and M5. When Clk_S goes low, the gate of transistor M5 is isolated and therefore the output current Iout is held constant. For different stages, the bias current can be scaled.

Figure 6:
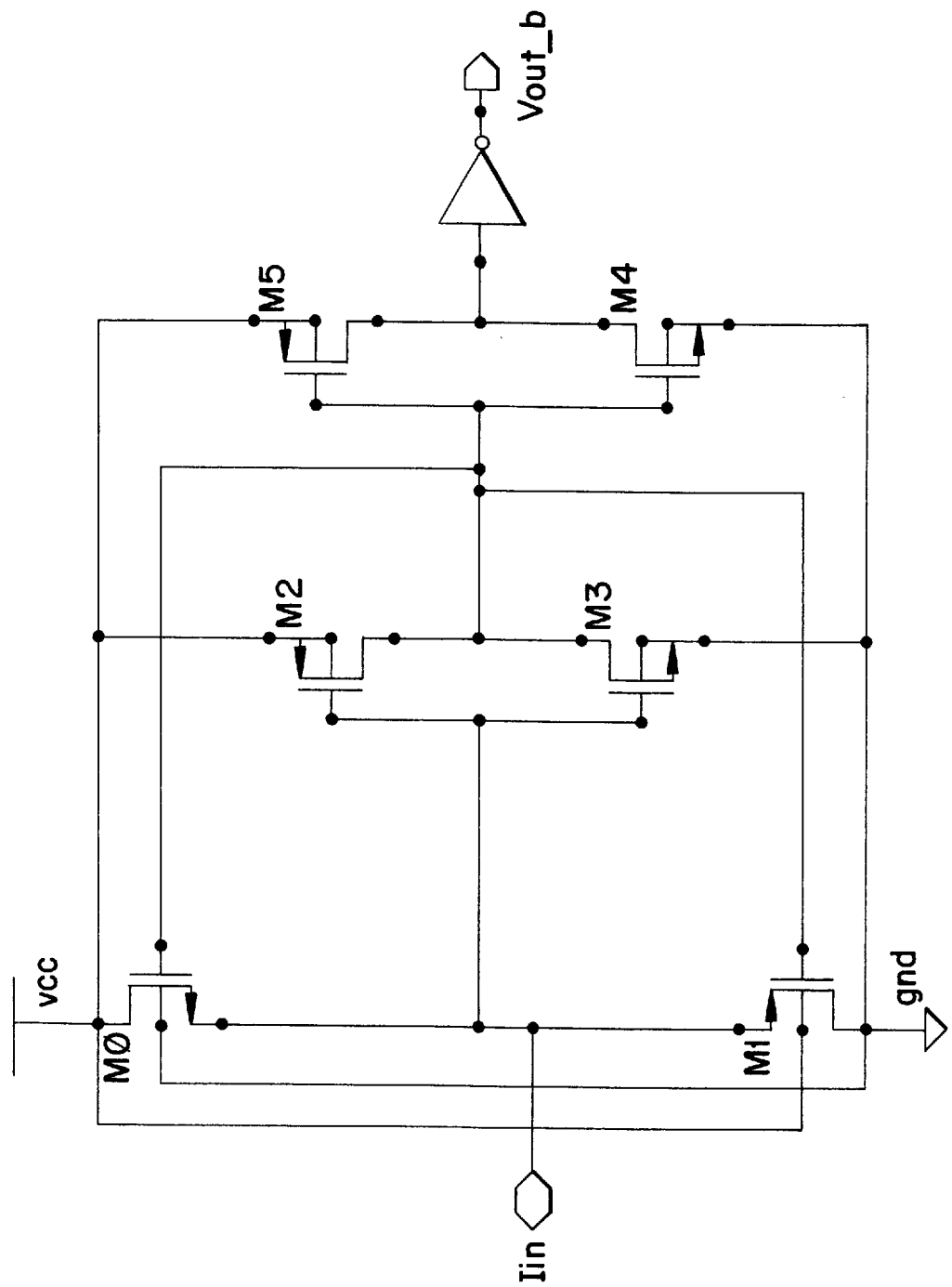
FIG. 6 shows a simplified circuit diagram of the 1-bit current quantizer.

In FIG. 6 the simplified circuit diagram of the 1-bit current quantizer is shown. The 1-bit current quantizer used is a low-impedance quantizer. Transistors M0 and M1 are the input transistors. Transistors M2 and M3 form an amplifier. When the input current Iin changes direction, any small potential change is amplified by the amplifier to make the change at the gates of M0 and M1 considerably large. This large voltage change is further amplified by another amplifier consisting of transistors M4 and M5, and an inverter is used to drive the output. To realize a multi-bit current quantizer, only reference current at the input will need to be provided.

Figure 7:
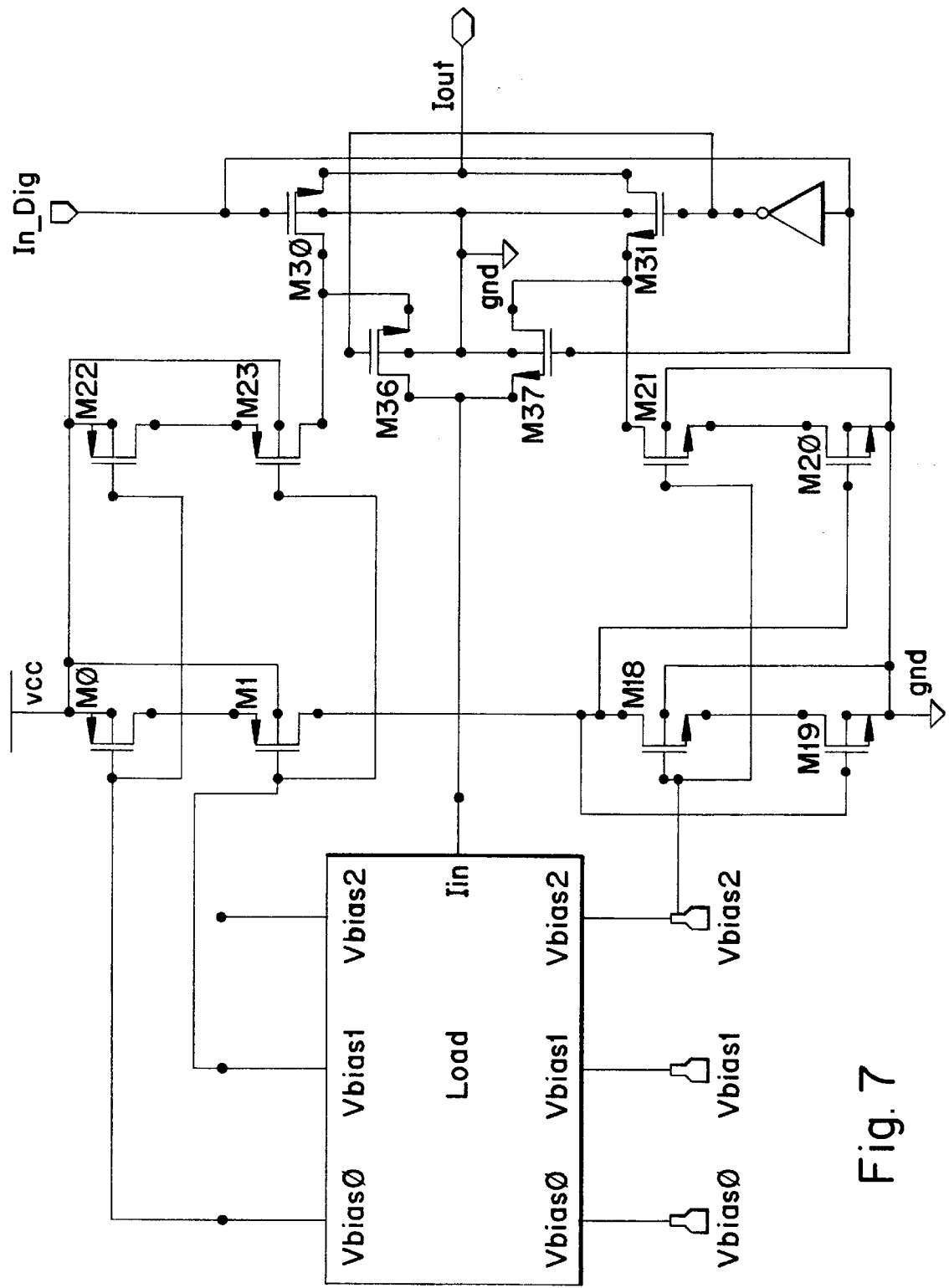
FIG. 7 shows a simplified circuit diagram of the 1-bit D/A converter.

In FIG. 7, the simplified circuit diagram of the 1-bit D/A converter is shown. The D/A converter is basically a cascode current source consisting of transistor M22 and M20, and their cascode transistors M23, M21 respectively. The branch consisting of transistor M0, M1, M10 and M18 is only used to provide the bias voltage for transistor M20 to guarantee that the drain current in M20 is equal to the drain current in M22. Transistors M31, M50, M36, M37 are used as switches. Depending on the digital input In-Dig, either the current in M22 or the current in M20 is switched to the output. At the same time, the other current, which is not switched to the output is switched to a load to avoid drastic voltage change when a current source is open circuited. The load is only a current mirror providing a low impedance at its input. Vbias0~2 are the bias voltages.

While the foregoing description includes numerous details and specificities, it is to be understood that these are merely illustrative of the present invention, and are not to be construed as limitations. Many modifications will be readily apparent to those skilled in the art which do not depart from the spirit and scope of the invention, as defined by the appended claims and their legal equivalents.

I claim:

1. A device to convert an analog current to a digital signal particularly where the device relates to the design of high-speed pipelined analog-to-digital (A/D) converters, characterized by comprising an S/H circuit (7) at an input and N pipelined stages (8), each of them comprising an internal low resolution A/D converter (9), a D/A converter (10), an S/H circuit (11), a reference current source (12) and an adder/subtractor (13), wherein every stage (8) does not have to be identical to any other, and wherein, in the stages (8), the inter stage A/D converter (9) and the S/H circuit (11) are timeinterleaved to reduce capacitive load in order to have high speed.

2. A device according to claim 1, characterized by, in the stages (8), a scaling of reference currents is provided for resulting in scaling of bias currents for every stage in order to reduce power consumption.

3. A device according to claim 1, characterized by amplification of an output of the S/H circuit (11) in at least one least significant (LSB) stage (8) to reduce the spread of reference currents.

4. A method of performing pipelined analog-to-digital conversion, wherein bits of a digital output value are generated via a succession of hardware stages, each hardware stage utilizing a reference current to generate at least one bit of the digital output value, comprising the steps of:

provproviding a first reference current to a first of the hardware stages; and scaling the first reference current to provide a scaled reference current to at least a second of the hardware stages, wherein each hardware stage includes a sample-and-hold circuit and an analog-to-digital converter, further comprising the step of time-interleaving inputs to the sample-and-hold circuit and the analog-to-digital converter in at least one of the hardware stages.

5. A method of performing pipelined analog-to-digital conversion, wherein bits of a digital output value are generated via a succession of hardware stages, each hardware stage utilizing a reference current to generate at least one bit of the digital output value, comprising the steps of:

providing a first reference current to a first of the hardware stages; and scaling the first reference current to provide a scaled reference current to at least a second of the hardware stages, further comprising the step of providing an unscaled reference current to a least-significant-bit stage.

6. A pipelined analog-to-digital converter for converting an analog current to a digital signal comprising: a sample-and-hold circuit at an input and N pipelined stages, each stage comprising an internal low resolution analog-to-digital converter, a digital-to-analog converter, a sample-and-hold circuit and an adder/subtractor, wherein a reference current source of a first of the stages is scaled to provide a scaled reference current source for at least one other of the stages, wherein inputs to the sample-and-hold circuit and the analog-to-digital converter in each pipelined stage are time-interleaved.

7. A pipelined analog-to-digital converter for converting an analog current to a digital signal comprising: a sample-and-hold circuit at an input and N pipelined stages, each stage comprising an internal low resolution analog-to-digital converter, a digital-to-analog converter, a sample-and-hold circuit and an adder/subtractor, wherein a reference current source of a first of the stages is scaled to provide a scaled reference current source for at least one other of the stages, wherein an unscaled current reference source is provided to a least-significant-bit pipelined stage.

* * * * *